US008767452B2

(12) United States Patent
Kito et al.

(10) Patent No.: US 8,767,452 B2
(45) Date of Patent: Jul. 1, 2014

(54) SEMICONDUCTOR MEMORY DEVICE

(75) Inventors: Masaru Kito, Mie-ken (JP); Tomoko Fujiwara, Kanagawa-ken (JP); Hideaki Aochi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 29 days.

(21) Appl. No.: 13/418,651

(22) Filed: Mar. 13, 2012

(65) Prior Publication Data

US 2013/0058163 A1 Mar. 7, 2013

(30) Foreign Application Priority Data

Sep. 2, 2011 (JP) ................................. 2011-191643

(51) Int. Cl.
*G11C 11/14* (2006.01)
*G11C 11/00* (2006.01)

(52) U.S. Cl.
USPC ........... 365/171; 365/158; 365/173; 257/324; 257/326

(58) Field of Classification Search
USPC ......... 365/148, 158, 163, 171, 172, 173, 174, 365/184; 257/E29.255, 314, E21.665, 257/E21.422, 324, 326
See application file for complete search history.

(56) References Cited

U.S. PATENT DOCUMENTS

| | | | |
|---|---|---|---|
| 2010/0207190 A1* | 8/2010 | Katsumata et al. | ........... 257/319 |
| 2010/0207195 A1 | 8/2010 | Fukuzumi et al. | |
| 2010/0244119 A1* | 9/2010 | Fukuzumi et al. | ............ 257/324 |

FOREIGN PATENT DOCUMENTS

| | | |
|---|---|---|
| JP | 2010-511266 | 4/2010 |
| WO | WO 2008/067494 A1 | 6/2008 |

* cited by examiner

*Primary Examiner* — Richard Elms
*Assistant Examiner* — Hien Nguyen
(74) *Attorney, Agent, or Firm* — Oblon, Spivak, McClelland, Maier & Neustadt, L.L.P.

(57) ABSTRACT

According to one embodiment, a semiconductor memory device includes a stacked body, a semiconductor pillar, a charge storage layer, a tunneling layer, a dividing trench and a first heating unit. The stacked body includes a plurality of first insulating films stacked alternately with a plurality of electrode films. The semiconductor pillar pierces the stacked body. The charge storage layer is provided between the electrode films and the semiconductor pillar. The tunneling layer is provided between the charge storage layer and the semiconductor pillar. The dividing trench is provided between the semiconductor pillars in one direction orthogonal to a stacking direction of the stacked body to divide the electrode films. The first heating unit is provided in an interior of the dividing trench.

18 Claims, 9 Drawing Sheets

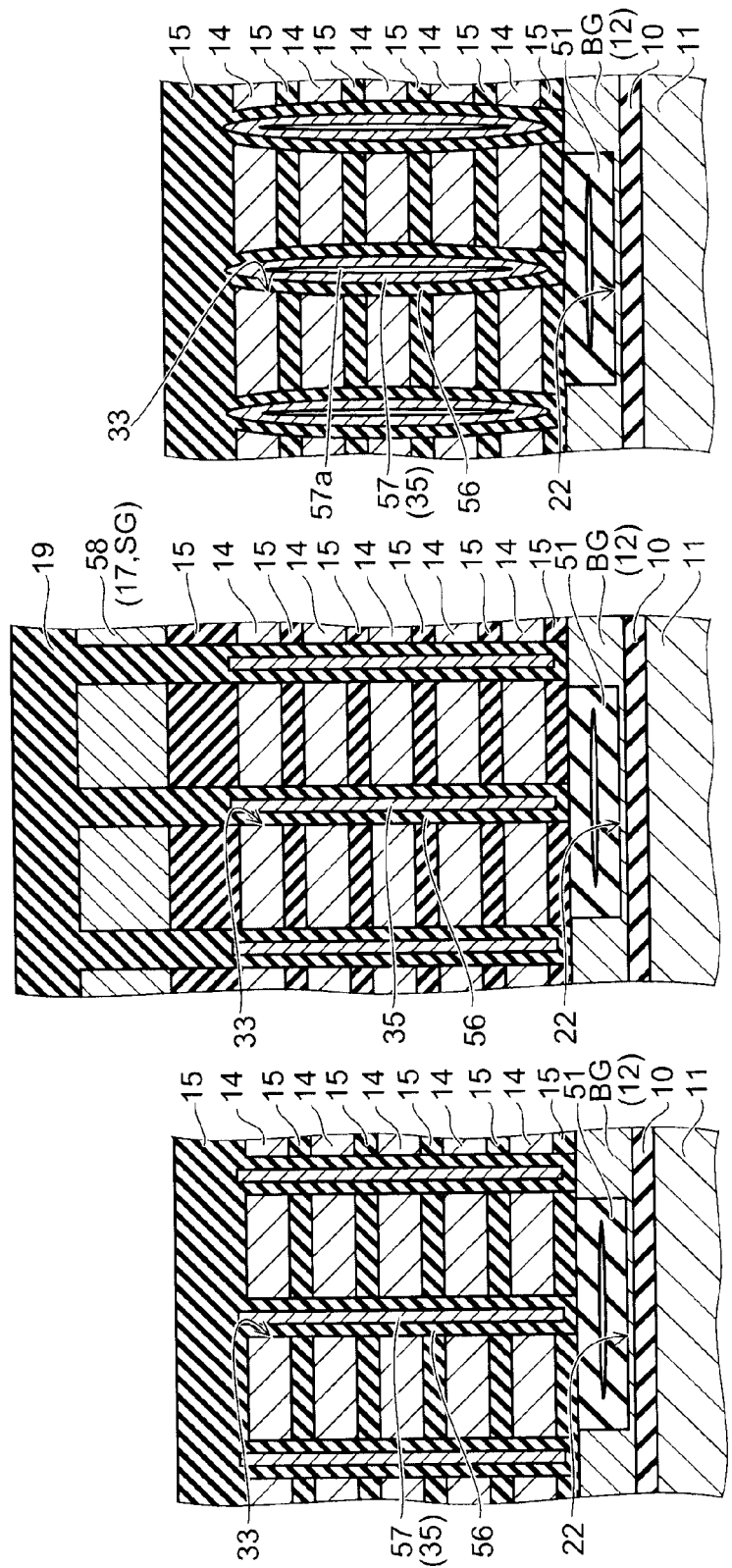

SEMICONDUCTOR MEMORY DEVICE

CROSS-REFERENCE TO RELATED APPLICATIONS

This application is based upon and claims the benefit of priority from the prior Japanese Patent Application No. 2011-191643, filed on Sep. 2, 2011; the entire contents of which are incorporated herein by reference.

FIELD

Embodiments described herein relate generally to a semiconductor memory device.

BACKGROUND

In the field of semiconductor memory devices, three-dimensionally stacked memory for which higher integration is possible with relatively no constraints due to the limits of the resolution of lithography is drawing attention. Such a three-dimensionally stacked memory includes, for example, memory strings disposed two-dimensionally in a matrix configuration, where the memory string includes: a semiconductor pillar having a columnar configuration; a tunneling layer, a charge storage layer, and a blocking layer stacked to cover the side surface of the semiconductor pillar; and multiple electrode films provided at a prescribed spacing in the stacking direction to intersect the semiconductor pillar.

In such a three-dimensionally stacked memory, electrons are trapped inside the tunneling layer when a programming/erasing operation is repeatedly performed. Then, there is a risk that reliability of the data retention characteristics may be lost when the trapped electrons are de-trapped.

BRIEF DESCRIPTION OF THE DRAWINGS

FIGS. 8A and 8B are schematic cross-sectional views of processes continuing from FIGS. 7A and 7B, and FIG. 8C is a schematic cross-sectional view showing a case where bowing dividing trenches are formed.

DETAILED DESCRIPTION

Figure 1:
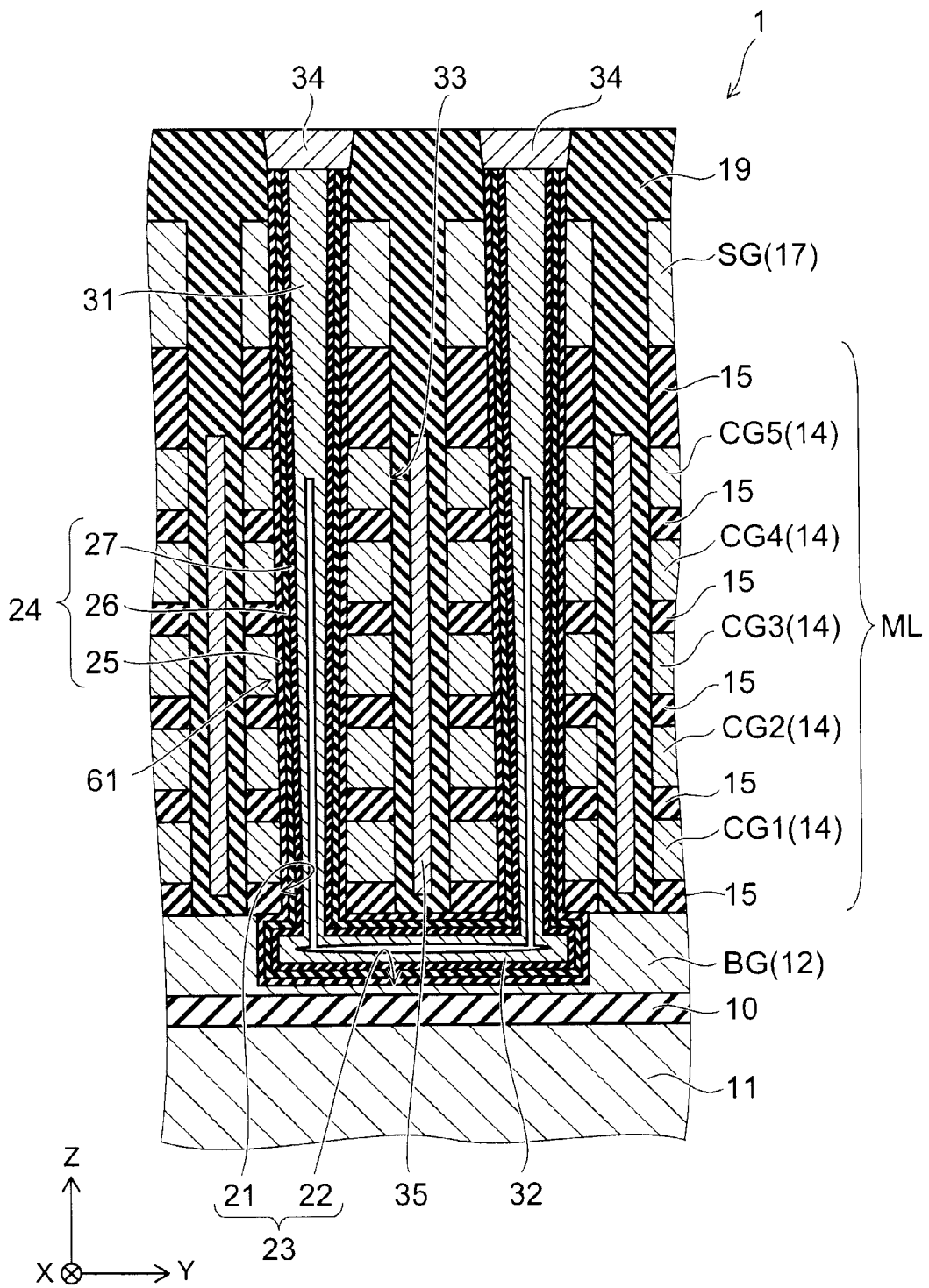
FIG. 1 is a schematic cross-sectional view illustrating the semiconductor memory device according to the first embodiment.

In general, according to one embodiment, a semiconductor memory device includes a stacked body, a semiconductor pillar, a charge storage layer, a tunneling layer, a dividing trench and a first heating unit. The stacked body includes a plurality of first insulating films stacked alternately with a plurality of electrode films. The semiconductor pillar pierces the stacked body. The charge storage layer is provided between the electrode films and the semiconductor pillar. The tunneling layer is provided between the charge storage layer and the semiconductor pillar. The dividing trench is provided between the semiconductor pillars in one direction orthogonal to a stacking direction of the stacked body to divide the electrode films. The first heating unit is provided in an interior of the dividing trench.

Embodiments will now be illustrated with reference to the drawings. Similar components in the drawings are marked with like reference numerals, and a detailed description is omitted as appropriate.

In the drawings, an X direction, a Y direction, and a Z direction are taken to be orthogonal to each other; the X direction and the Y direction are taken to be parallel to a major surface of a substrate 11; and the Z direction is taken to be a direction (a stacking direction) orthogonal to the major surface of the substrate 11.

First Embodiment

A semiconductor memory device 1 includes a memory region where memory cells configured to store data are formed and a peripheral circuit region where a peripheral circuit configured to drive the memory cells of the memory region is formed. In this case, because known technology can be applied to the peripheral circuit region, the peripheral circuit region is not illustrated; and the memory region is illustrated herein.

FIG. 1 is a schematic cross-sectional view illustrating the semiconductor memory device according to the first embodiment.

Figure 2:
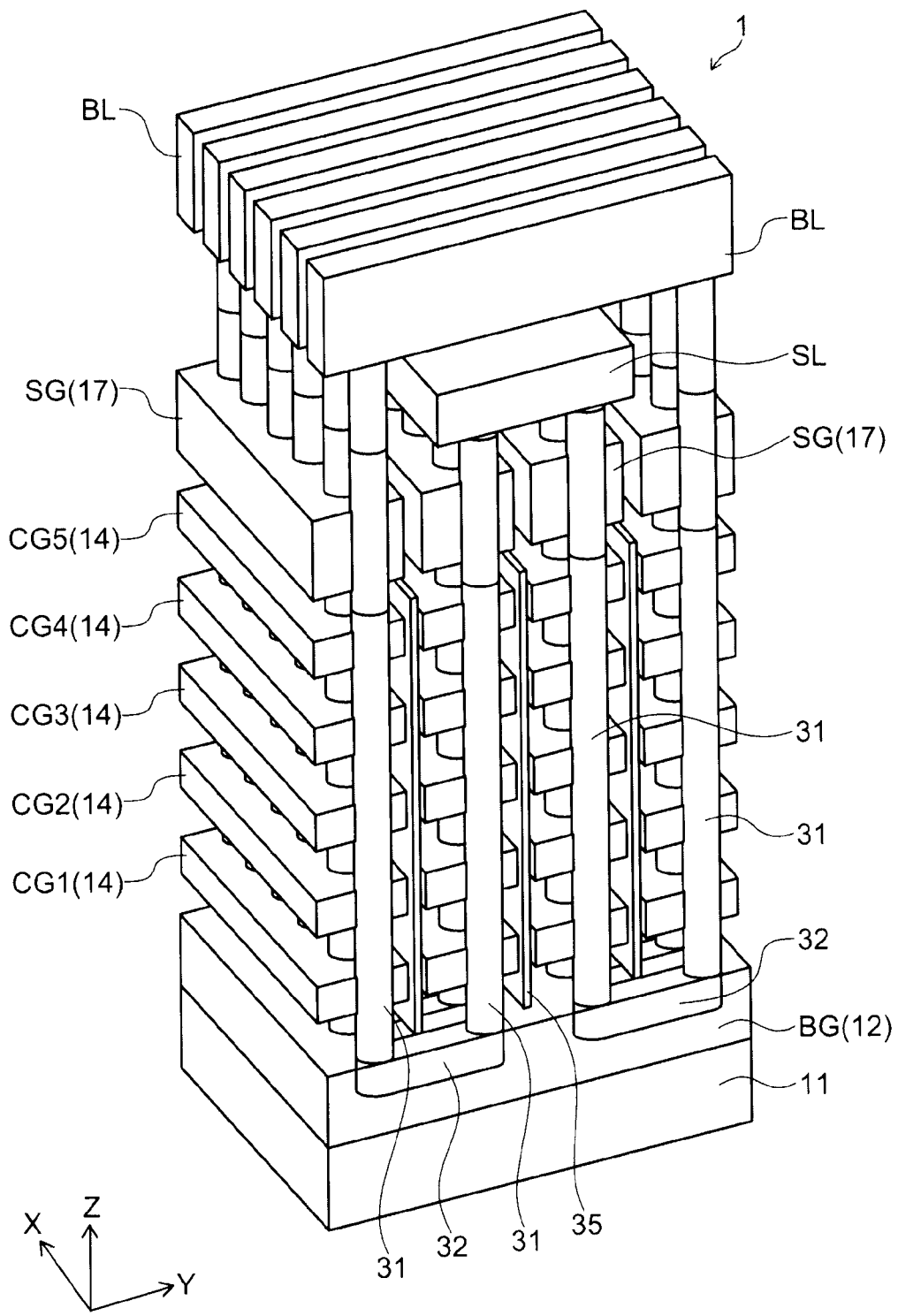
FIG. 2 is a schematic perspective view illustrating the semiconductor memory device.

FIG. 2 is a schematic perspective view illustrating the semiconductor memory device.

To avoid complexity in FIG. 2, only the conductive portions are illustrated; and the insulating portions are not illustrated.

As illustrated in FIG. 1 and FIG. 2, the substrate 11 is provided in the memory region of the semiconductor memory device 1. The substrate 11 may be formed using, for example, monocrystalline silicon. An insulating film 10 is formed on the substrate 11. A conductive film, e.g., a polysilicon film 12, is formed on the insulating film 10; and this conductive film is used as a back gate electrode BG. Multiple electrode films 14 and multiple insulating films 15 (corresponding to examples of first insulating films) are stacked alternately on the back gate electrode BG. A stacked body ML includes the multiple electrode films 14 and the multiple insulating films 15.

The electrode films 14 may be formed using, for example, polysilicon. The electrode films 14 are divided along the Y direction and are used as multiple control gate electrodes CG extending in the X direction. When viewed from the Z direction, each layer of electrode films 14 is patterned in the same pattern. Therefore, the control gate electrodes CG are arranged in a matrix configuration as viewed from the X direction. In FIG. 1, the nth control gate electrode CG from the bottom (where n is a natural number) is labeled as "the control gate electrode CGn." On the other hand, the insulating films 15 are formed using, for example, silicon oxide and function as inter-layer insulating films that insulate the electrode films 14 from each other.

A conductive film 17 is provided on the stacked body ML. The conductive film 17 may be formed using, for example, polysilicon. The conductive film 17 is divided along the Y direction and is used as multiple selection gate electrodes SG extending in the X direction. The selection gate electrodes SG are provided in the regions directly above the control gate electrodes CGS.

An insulating film 19 is provided above the conductive film 17. The insulating film 19 may be formed using, for example, silicon oxide.

Multiple through-holes 21 extending in the stacking direction (the Z direction) are made to pierce the stacked body ML. The through-holes 21 pierce each layer of the control gate electrodes CG; and the lower ends of the through-holes 21 reach the back gate electrodes BG. The through-holes 21 are arranged in a matrix configuration along the X direction and the Y direction. Because the control gate electrodes CG extend in the X direction, the through-holes 21 arranged in the X direction pierce the same control gate electrodes CG.

A linking hole 22 is made in the upper layer of the back gate electrode BG. One continuous U-shaped hole 23 is made of two through-holes 21 that are adjacent to each other in the Y direction and a linking hole 22 that links the two through-holes 21 to each other. Multiple U-shaped holes 23 are made inside the stacked body ML.

A blocking layer 25 is provided on the inner surfaces of the through-holes 21 and the linking hole 22. The blocking layer 25 is a layer in which current substantially does not flow even in the case where a voltage within the range of the drive voltage of the semiconductor memory device 1 is applied and may be formed using, for example, silicon oxide.

A charge storage layer 26 is provided on the inner side of the blocking layer 25. The charge storage layer 26 is a layer capable of storing charge and may be, for example, a layer including trap sites of electrons. The charge storage layer 26 may be formed using, for example, silicon nitride.

A tunneling layer 27 is provided on the inner side of the charge storage layer 26. Although the tunneling layer 27 normally is insulative, a tunneling current flows when a prescribed voltage within the range of the drive voltage of the semiconductor memory device 1 is applied. The tunneling layer 27 may be formed using, for example, silicon oxide.

Semiconductor pillars 31 and a connection member 32 are provided on the inner side of the tunneling layer 27. In other words, the semiconductor pillars 31 are provided to pierce the stacked body ML.

The semiconductor pillar 31 has a hollow columnar configuration (a tubular configuration) extending in the Z direction through the through-hole 21; and the semiconductor pillar 31 may have, for example, a cylindrical configuration.

The connection member 32 has a hollow columnar configuration extending in the Y direction through the linking hole 22; and the connection member 32 may have, for example, a tubular configuration.

The two semiconductor pillars 31 adjacent to each other in the Y direction are connected to each other by the connection member 32. The two semiconductor pillars 31 and the connection member 32 are formed continuously without a break.

The semiconductor pillar 31 and the connection member 32 may be formed using, for example, polysilicon.

A source/drain region portion 34 into which arsenic is ion-implanted is provided at the upper end portion of the semiconductor pillar 31.

One of the two semiconductor pillars 31 connected to each other by the connection member 32 is connected via the source/drain region portion 34 to a source line; and the other is connected via the source/drain region portion 34 to a bit line BL. By such a configuration, the charge storage layer 26 is disposed between the control gate electrodes CG and the semiconductor pillar 31; and a memory cell 24 is formed at each of the intersections between the control gate electrodes CG and the semiconductor pillar 31.

In other words, a memory string 61 that is connected from the bit line BL to a source line SL is formed along a pillar having a U-shaped configuration that is formed of the semiconductor pillars 31 and the connection member 32.

A block that includes multiple memory strings 61 formed along the stacking direction of the semiconductor pillar 31 is multiply provided (referring to FIG. 2 and the like). The erasing of the data can be performed by block unit.

A dividing trench 33 is provided between the semiconductor pillars 31 in the Y direction (corresponding to an example of one direction orthogonal to the stacking direction of the stacked body ML) to divide the control gate electrodes CG. An insulator such as silicon oxide and the like is filled into the interior of the dividing trench 33. The opening of the upper end of the dividing trench 33 is plugged with the insulating film 19.

Although the source line SL and the bit line BL and not-illustrated vias, contacts, draw-out interconnects, upper layer interconnects, and the like are provided above the insulating film 19, known technology can be applied to these components; and a detailed description is therefore omitted.

In the semiconductor memory device 1 herein, electrons are injected from the semiconductor pillar 31 via the tunneling layer 27 into the charge storage layer 26 when programming the data. Then, when erasing the data, pair annihilation of the electrons inside the charge storage layer 26 is caused by holes being injected into the charge storage layer 26 by causing a potential difference between the semiconductor pillar 31 and the control gate electrode CG. When such a programming/erasing operation is repeatedly performed, electrons are trapped inside the tunneling layer 27; and there are cases where reliability of the data retention characteristics is lost due to the trapped electrons being de-trapped.

According to knowledge obtained by the inventors, the electrons trapped inside the tunneling layer 27 can be de-trapped by heating the portion in which the electrons are trapped to a prescribed temperature. It was also confirmed that the reliability of the data retention characteristics can be recovered by de-trapping the electrons trapped inside the tunneling layer 27 by heating. Therefore, the semiconductor memory device 1 includes a heating unit 35 (corresponding to an example of the first heating unit) that is configured to heat the portion in which the electrons are trapped.

The heating unit 35 will now be illustrated further.

The heating unit 35 can de-trap the trapped electrons by, for example, heating the tunneling layer 27.

As illustrated in FIG. 1, the heating unit 35 is provided in the interior of the dividing trench 33 and has a periphery that is covered with an insulator. The heating unit 35 has, for example, a plate configuration and may be capable of generating Joule heat. In the case where the heating unit 35 is capable of generating Joule heat, the heating unit 35 may be formed using a conductor. For example, the heating unit 35 may be formed using TiN, a metal, and the like. In the case where the heating unit 35 is formed using TiN, a metal, and the like, the thermal dissipation rate can be faster because the thermal conductivity is high. Therefore, the confinement of heat inside the semiconductor memory device 1 can be suppressed.

If the heating unit 35 is provided in the interior of the dividing trench 33, the heating can be performed not only for the entire semiconductor memory device 1 but also by memory string, by multiple memory strings, by block, and by multiple blocks for those to undergo the de-trapping. In other words, the heating unit 35 can perform the heating by region, where each of the regions includes at least one memory string. Therefore, the electrons can be de-trapped by region, where each of the regions includes at least one memory string.

In such a case, the de-trapping of the electrons can be limited to the desired block because the conduction of the heat between adjacent blocks can be suppressed by providing a layer configured to suppress the conduction of heat between the blocks (e.g., a layer formed using a material having a low thermal conductivity).

Also, if the heating unit 35 is provided in the interior of the dividing trench 33, the de-trapping of the electrons can be performed efficiently because the heating unit 35 is provided proximally to the portion in which the electrons are trapped. In such a case, many of the electrons are trapped proximally to the memory cells 24. Therefore, in the case where the thermal conductivity of the control gate electrodes CG is relatively high, the portion in which many of the electrons are trapped can be locally heated via the control gate electrodes CG.

A method for de-trapping electrons will now be illustrated.

The de-trapping of the electrons may be performed in the case where the programming/erasing operation is performed a prescribed number of times.

In the case where the electrons are de-trapped by heating, the programmed data of the region to undergo the de-trapping also is erased. Therefore, first, the programmed data is transferred prior to performing the de-trapping of the electrons. For example, the programmed data of the region (e.g., the memory strings and the blocks) to undergo the de-trapping of the electrons may be transferred to a region not to undergo the de-trapping of the electrons. The programmed data also may be transferred to an externally-provided memory device.

The de-trapping of the electrons also may be performed by a method such as the following method.

Normally, when performing the programming of the data, the programming is performed once the data is erased. Therefore, the de-trapping of the electrons by heating may be performed at the timing of this erasing operation. For example, new data is programmed once the data programmed to the memory cells is erased. At this time, the de-trapping of the electrons by heating is performed for the desired string (or block). If the heating unit 35 (e.g., a heater) is formed from a material having high thermal conductivity such as a metal and the like, it is possible to perform the heating and the cooling in a short period of time. Therefore, the de-trapping of the electrons can be completed in the erasing operation. Thus, the reliability can be increased because the de-trapping of the electrons can be completed and the new programming of the memory cells for which the data is erased can be performed.

Although the number of the excess trapped electrons increases as the programming/erasing operation is performed repeatedly, the excess electrons can be de-trapped in each erasing operation by the de-trapping operation of the electrons recited above being included in the erasing operation. Therefore, a semiconductor memory device having high reliability can be obtained.

Then, the region to undergo the de-trapping is heated by causing the heating unit 35 to operate. For example, the region to undergo the de-trapping may be heated by generating Joule heat by causing a current to flow in the heating unit 35.

The transferred data is returned to the original region (is again programmed to the original region) after the de-trapping by heating ends.

Loss of the data can be prevented by performing such transferring of the data.

The transferred data may be returned to the original region; or the transferred data may be programmed to another region, and the region for which the de-trapping of the electrons has ended may be used as a new programming region.

In the case where the de-trapping is performed for the entire semiconductor memory device 1, the programmed data may be transferred to an externally-provided memory device; and the transferred data may be returned to the semiconductor memory device 1 after the de-trapping.

The method for de-trapping electrons may be executed by, for example, a not-illustrated control unit provided in the peripheral circuit region and the like.

Figure 3A:
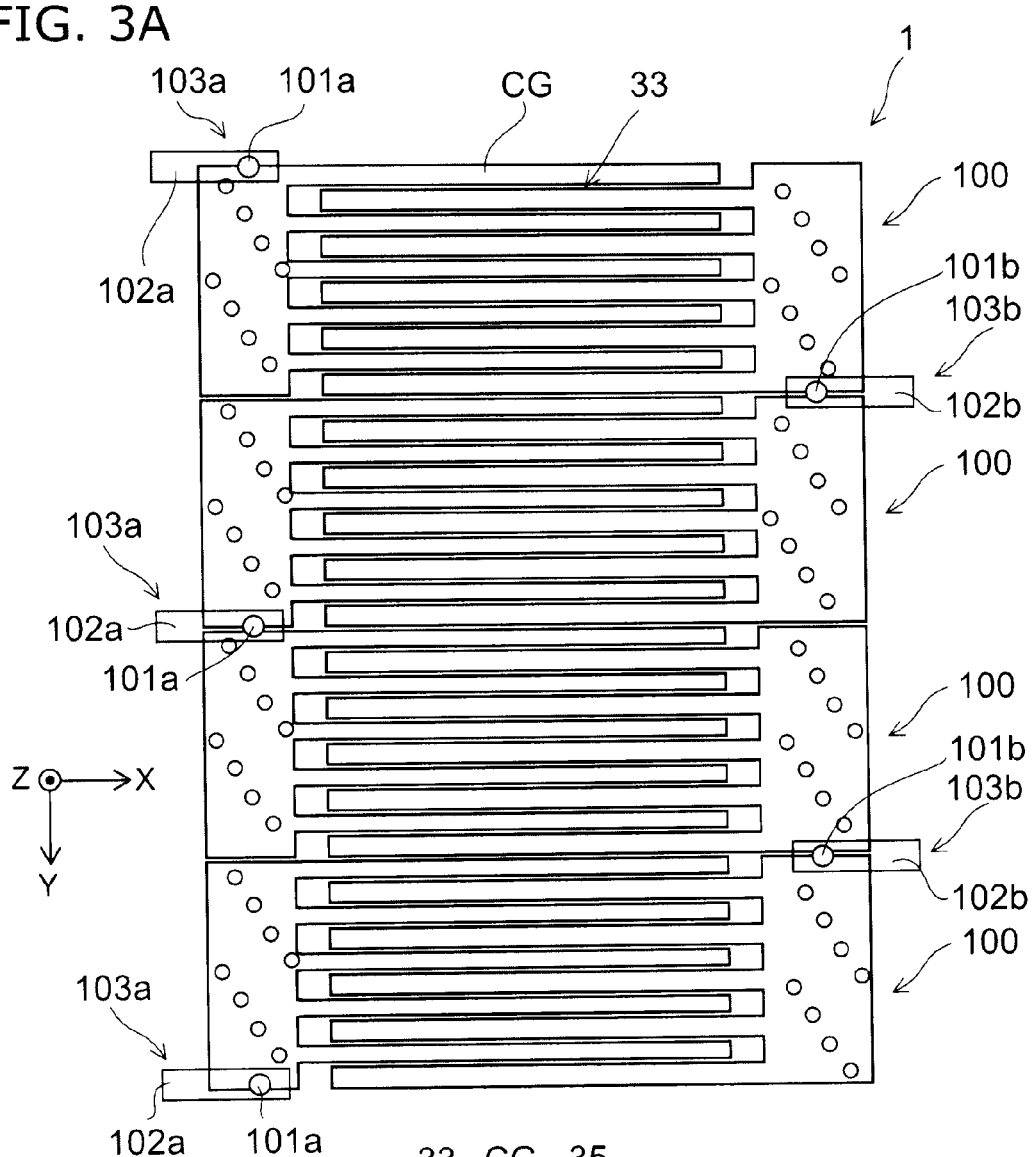
FIGS. 3A and 3B are schematic views illustrating the interconnects of the heating unit.
Figure 3B:
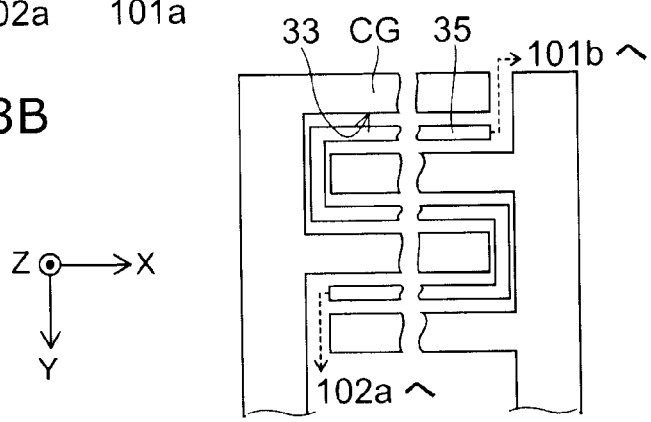

FIGS. 3A and 3B are schematic views illustrating the interconnects of the heating unit. FIG. 3A is a schematic view illustrating the case where the interconnects of the heating unit are performed by block; and FIG. 3B is a schematic partially-enlarged view. Only the draw-out portions of the interconnects of the heating unit 35 are illustrated in FIG. 3A to avoid complexity.

In the semiconductor memory device 1 as illustrated in FIG. 3A, a block 100 that includes multiple memory strings is multiply provided. As illustrated in FIG. 3B, the heating unit 35 is provided in the interior of the dividing trench 33 that is provided between the control gate electrodes CG.

Here, the draw-out portions of the interconnects are necessary to connect the heating unit 35 provided in the interior of the dividing trench 33 to the power source and the control unit provided in the peripheral circuit region and the like.

In this embodiment, draw-out portions 103*a* and 103*b* of the interconnects are provided for each of the blocks 100. For example, as illustrated in FIG. 3A, the draw-out portions 103*a* and 103*b* of the interconnects may be formed by providing contacts 101*a* and 101*b* between the blocks 100 and by using the contacts 101*a* and 101*b* to connect the heating unit 35 that is provided inside the block 100 to external interconnects 102*a* and 102*b*. In such a case, the draw-out portions 103*a* and 103*b* can be shared between adjacent blocks 100.

Figure 4:
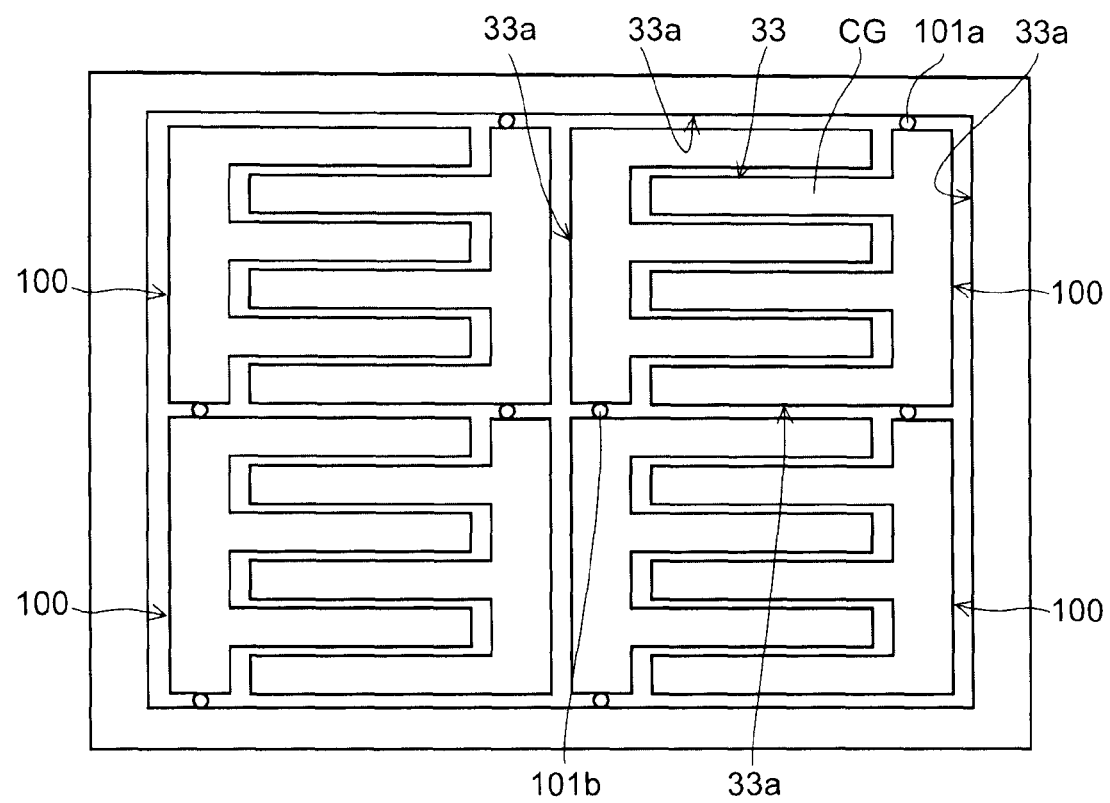
FIG. 4 is a schematic view illustrating the interconnects of the heating unit according to another embodiment.

FIG. 4 is a schematic view illustrating the interconnects of the heating unit according to another embodiment.

As illustrated in FIG. 4, there are cases where the block 100 that includes multiple memory strings is provided in a matrix configuration. In such a case, not only is the dividing trench 33 provided in the interior of the blocks 100, but also a dividing trench 33*a* is provided in a periphery of the blocks 100; and the heating unit (corresponding to an example of the second heating unit) is provided also in the interior of the dividing trench 33*a* that is provided in the periphery of the blocks 100.

In such a case, the resistance of the interconnects outside the blocks 100 is less than that of the interconnects inside the blocks 100 because the interconnect length outside the blocks 100 is shorter than the interconnect length inside the blocks 100. Therefore, there is a risk that the temperature difference inside and outside the blocks 100 may increase.

In such a case, simulations and the like may be performed to provide the contacts 101*a* and 101*b* at positions such that the temperature difference inside and outside the blocks 100 is reduced.

Figure 5A:
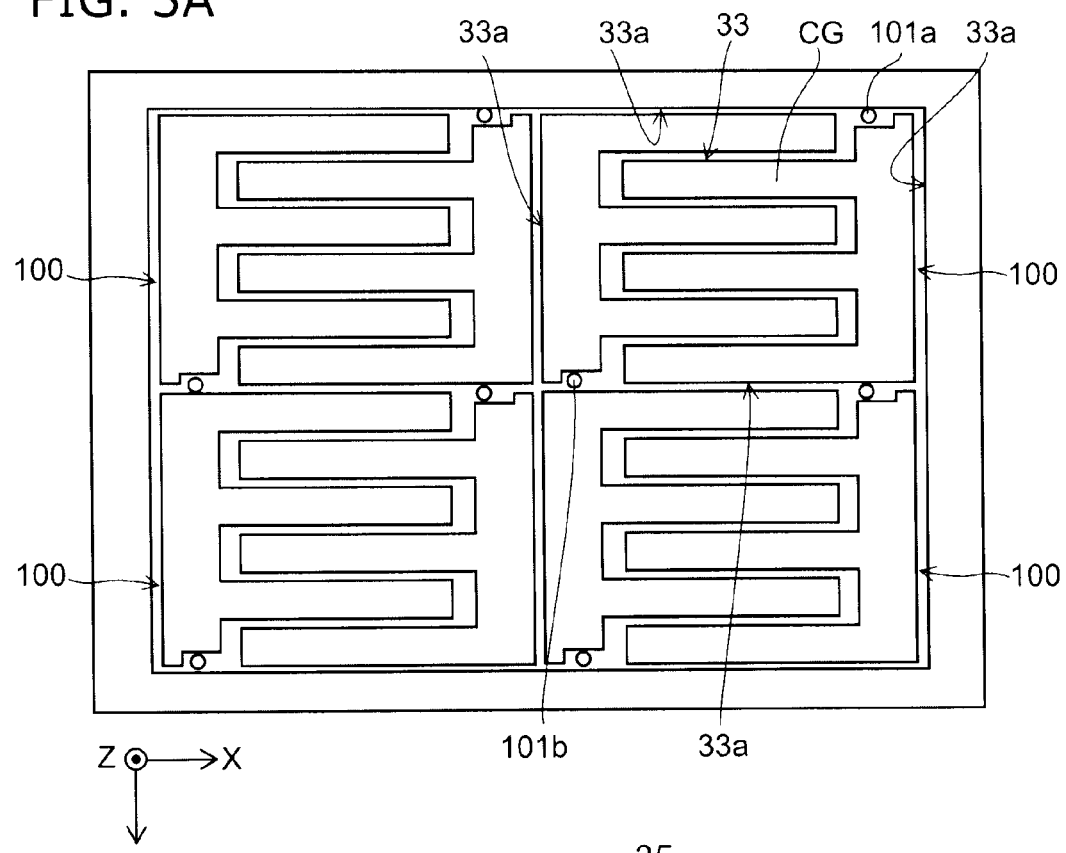
FIGS. 5A and 5B also are schematic views illustrating the interconnects of the heating unit according to another embodiment.
Figure 5B:
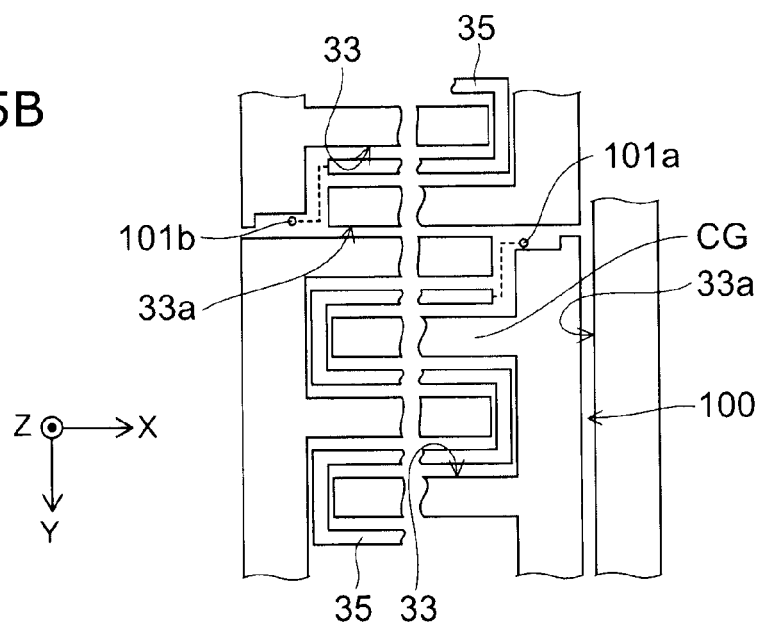

FIGS. 5A and 5B also are schematic views illustrating the interconnects of the heating unit according to another embodiment. FIG. 5A is a schematic view illustrating the interconnects of the heating unit; and FIG. 5B is a schematic partially-enlarged view. Only the draw-out portions of the interconnects of the heating unit 35 are illustrated in FIG. 5A to avoid complexity.

Although known film formation methods may be used to form the heating unit as described below, this would result in the heating unit being formed in the periphery of the blocks 100 as described above.

Therefore, in this embodiment, the heating unit is not provided in the interior of the dividing trench 33a that is provided in the periphery of the blocks 100.

In such a case, for example, the width dimension of the dividing trench 33a that is provided in the periphery of the blocks 100 may be reduced such that the heating unit is not provided in the interior of the dividing trench 33a. If the width dimension of the dividing trench 33a is small, only an insulator such as silicon oxide and the like is filled into the interior of the dividing trench 33a. Therefore, sneak current that flows on the periphery side of the blocks 100 can be eliminated when causing the current to flow in the heating unit via the contacts 101a and 101b.

Second Embodiment

Figure 6:
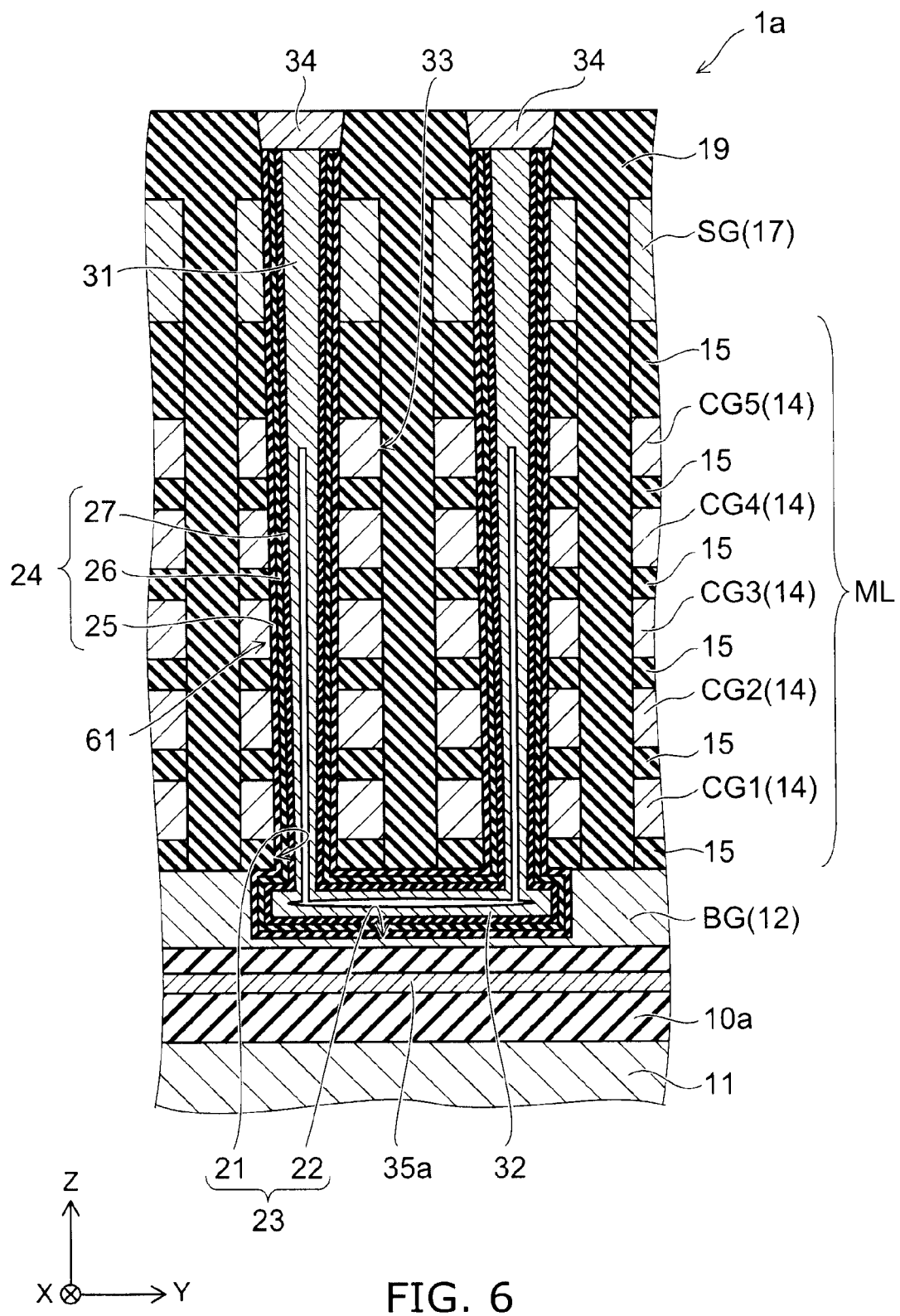
FIG. 6 is a schematic cross-sectional view illustrating a semiconductor memory device according to a second embodiment.

FIG. 6 is a schematic cross-sectional view illustrating a semiconductor memory device according to a second embodiment.

As illustrated in FIG. 6, the substrate 11 is provided in the memory region of the semiconductor memory device 1a. An insulating film 10a (corresponding to an example of a second insulating film) and the back gate electrode BG are stacked on the substrate 11. The multiple electrode films 14 and the multiple insulating films 15 are stacked alternately on the back gate electrode BG. The electrode films 14 are divided along the Y direction and are used as the multiple control gate electrodes CG extending in the X direction. The conductive film 17 is provided on the insulating film 15 of the uppermost layer. The conductive film 17 is divided along the Y direction and is used as the multiple selection gate electrodes SG extending in the X direction. The insulating film 19 is provided above the conductive film 17. One continuous U-shaped hole 23 is made of two through-holes 21 adjacent to each other in the Y direction and a linking hole 22 that links the two through-holes 21 to each other. The blocking layer 25, the charge storage layer 26, and the tunneling layer 27 are provided on the inner surfaces of the through-holes 21 and the U-shaped hole 23. The semiconductor pillars 31 and the connection member 32 are provided on the inner side of the tunneling layer 27. The source/drain region portion 34 is provided at the upper end portion of the semiconductor pillar 31. One of the two semiconductor pillars 31 is connected via the source/drain region portion 34 to a not-illustrated source line; and the other is connected via the source/drain region portion 34 to a not-illustrated bit line. The dividing trench 33 is provided between the semiconductor pillars 31 in the Y direction to divide the control gate electrodes CG. An insulator such as silicon oxide and the like is filled into the interior of the dividing trench 33. The opening of the upper end of the dividing trench 33 is plugged with the insulating film 19.

Although not-illustrated source lines, bit lines, vias, contacts, draw-out interconnects, upper layer interconnects, and the like are provided above the insulating film 19, known technology can be applied to these components; and a detailed description is therefore omitted.

In this embodiment, a heating unit 35a (corresponding to an example of a third heating unit) is provided in the interior of the insulating film 10a.

The insulating film 10a may be formed using, for example, silicon oxide. The heating unit 35a has, for example, a plate configuration and may be capable of generating Joule heat. In the case where the heating unit 35a is capable of generating Joule heat, the heating unit 35a may be formed using a conductor. For example, the heating unit 35a may be formed using TiN, a metal, and the like. In the case where the heating unit 35a is formed using TiN, a metal, and the like, the thermal dissipation rate can be faster because the thermal conductivity is high. Therefore, the confinement of heat inside the semiconductor memory device 1a can be suppressed.

If the heating unit 35a is provided in the interior of the insulating film 10a, the electrons can be de-trapped not only for the entire semiconductor memory device 1a but also by block for the blocks to undergo the de-trapping.

The degrees of freedom relating to the setting of the region that is heated can be increased because the configuration and the size of the heating unit 35a can be set relatively freely. The interconnects of the heating unit 35a also are easy.

Although the heating units 35 and 35a illustrated in the first embodiment and the second embodiment are configured to generate Joule heat by a current being caused to flow, this is not limited thereto. For example, an exothermic unit configured to generate Joule heat may be provided; and the generated heat may be conducted via a heat conduction unit to the heating units 35 and 35a that are provided proximally to the memory cells 24.

Third Embodiment

A method for manufacturing a semiconductor memory device according to a third embodiment will now be illustrated.

The method for manufacturing the semiconductor memory device illustrated below illustrates the case where the semiconductor memory device 1 illustrated in the first embodiment is manufactured.

Figure 7A:
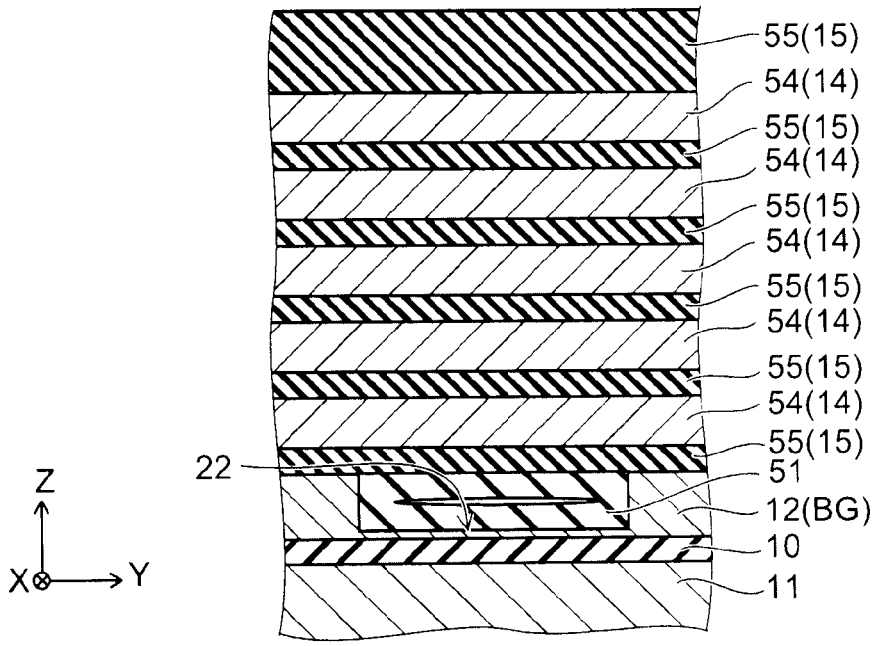
FIGS. 7A and 7B are schematic cross-sectional views of processes, illustrating the method for manufacturing the semiconductor memory device according to the third embodiment.
Figure 7B:
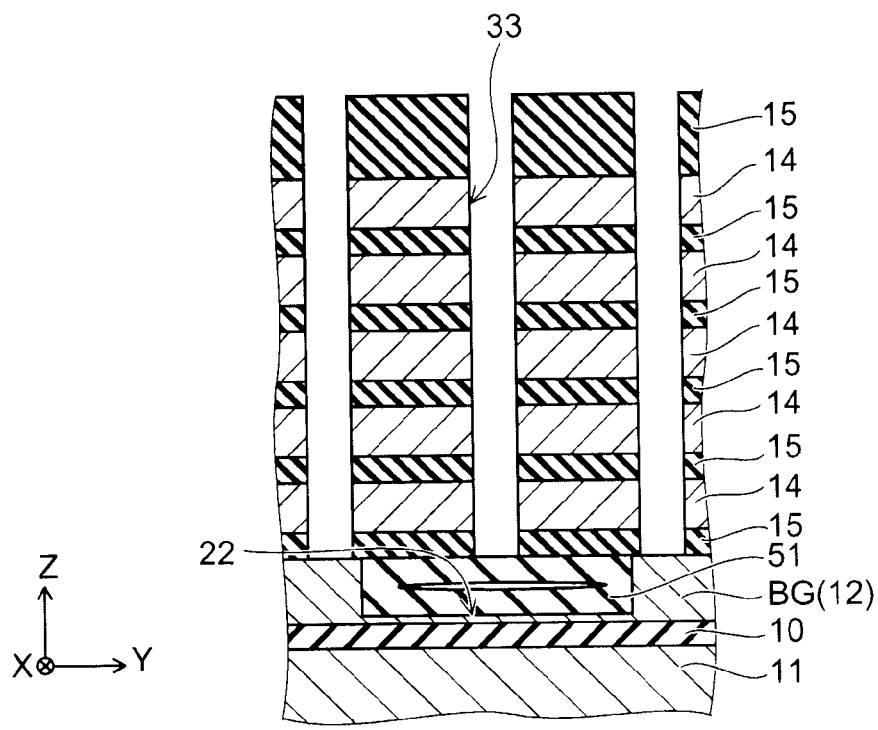

FIGS. 7A and 7B are schematic cross-sectional views of processes, illustrating the method for manufacturing the semiconductor memory device according to the third embodiment. FIG. 7A is a schematic cross-sectional view of a process; and FIG. 7B is a schematic cross-sectional view of a process continuing from FIG. 7A.

FIGS. 8A and 8B are schematic cross-sectional views of processes continuing from FIGS. 7A and 7B. FIG. 8A is a schematic cross-sectional view of a process continuing from FIG. 7B; and FIG. 8B is a schematic cross-sectional view of a process continuing from FIG. 8A, and FIG. 8C is a schematic cross-sectional view showing a case where bowing dividing trenches are formed.

Figure 9A:
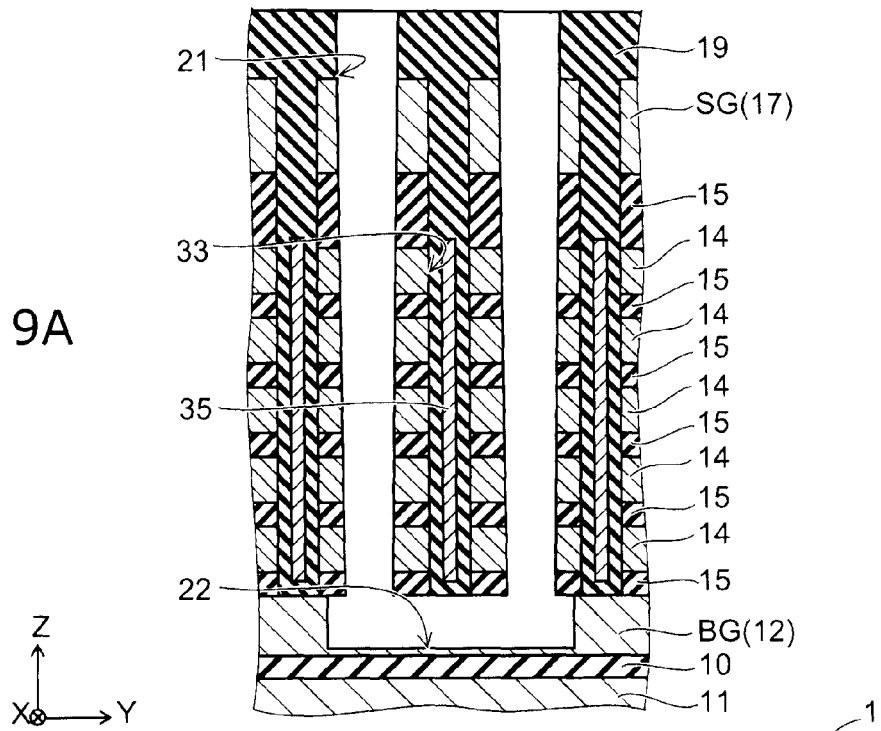
FIGS. 9A and 9B are schematic cross-sectional views of processes continuing from FIGS. 8A and 8B.
Figure 9B:
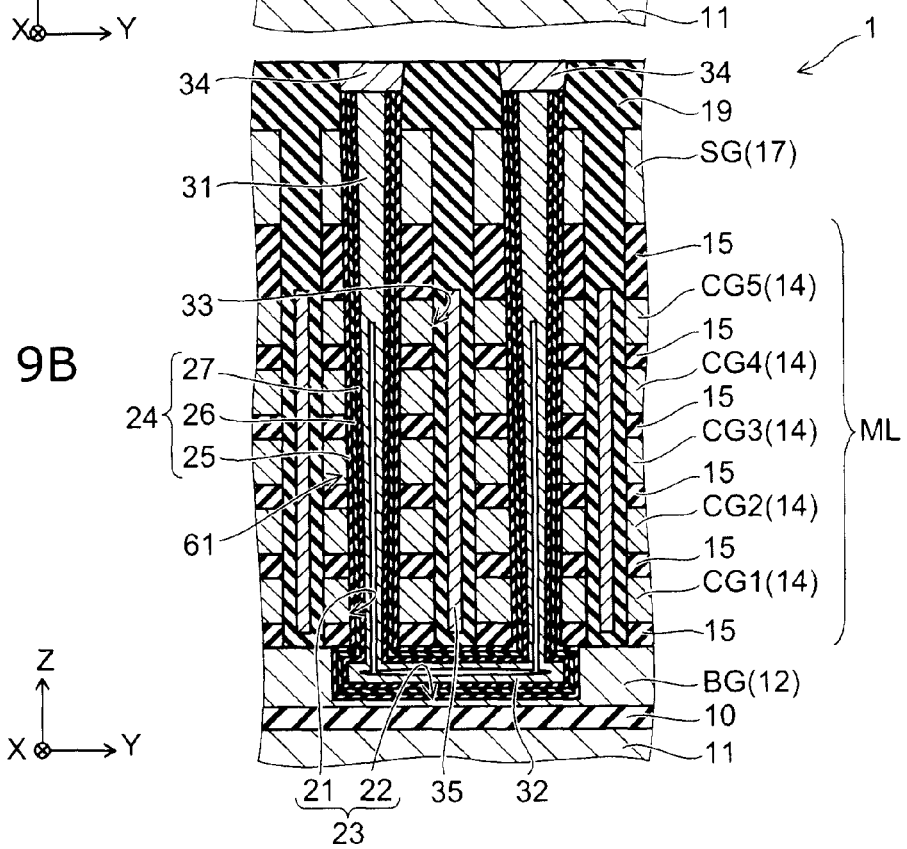

FIGS. 9A and 9B are schematic cross-sectional views of processes continuing from FIGS. 8A and 8B. FIG. 9A is a schematic cross-sectional view of a process continuing from FIG. 8B; and FIG. 9B is a schematic cross-sectional view of a process continuing from FIG. 9A.

First, a peripheral circuit is formed in a not-illustrated peripheral circuit region on the substrate 11.

Then, as illustrated in FIG. 7A, the insulating layer 10 and the polysilicon film 12 that is used to form the back gate electrode BG are formed in the memory region on the substrate 11. The insulating layer 10 may be formed using, for example, a silicon oxide film. In such a case, the insulating layer 10 and the back gate electrode BG may be formed using known film formation, lithography, and reactive ion etching methods.

Then, the linking hole 22 for connecting adjacent semiconductor pillars 31 is made inside the back gate electrode BG by using known lithography and reactive ion etching methods. Continuing, a silicon nitride film 51 used to form a sacrificial film is filled into the linking hole 22 by forming the silicon nitride film 51 and planarizing the surface of the silicon nitride film 51.

Subsequently, a silicon oxide film 55 used to form the insulating films 15 is formed alternately on the polysilicon film 12 with a polysilicon film 54 used to form the electrode films 14 by using sputtering and the like.

Then, as illustrated in FIG. 7B, a not-illustrated carbon film is formed on the entire surface by using CVD (Chemical Vapor Deposition); and the dividing trench 33 extending in the stacking direction of the stacked body is made by using known lithography and reactive ion etching methods. The dividing trench 33 divides the electrode films 14 in the Y direction. The electrode films 14 are divided along the Y direction and are used as the multiple control gate electrodes CG extending in the X direction.

Continuing as illustrated in FIG. 8A, an insulating film 56 such as a silicon oxide film and the like is formed on the side walls of the dividing trench 33 by using known film formation methods. Subsequently, a titanium nitride film 57 used to form the heating unit 35 is formed. Then, the heating unit 35 is formed in the interior of the dividing trench 33 by removing the titanium nitride film 57 formed on the upper surface of the stacked body by using dry etching, CMP (Chemical Mechanical Polishing), and the like. The insulating film 56 is again formed in the region where the titanium nitride film 57 is sunken due to the etch-back performed using the dry etching; and the insulating film 56 is planarized.

Then, as illustrated in FIG. 8B, a polysilicon film 58 used to form the conductive film 17 is formed. Then, the conductive film 17 which is the selection gate electrodes SG is formed by forming the polysilicon film 58 by using known lithography and reactive ion etching methods. Subsequently, the insulating film 19 is formed on the conductive film 17 by using silicon oxide and the like; and the surface of the insulating film 19 is planarized.

FIG. 8A exemplarily shows a case where linear dividing trenches 33 are formed. In contrast, in cases such as a case where an aspect ratio is high, bowing dividing trenches 33 may be formed, where cross section of the dividing trenches 33 becomes larger at their middle part. In such a case, the titanium nitride film 57 which forms the heating unit 35 becomes bowing as well. Further, a cavity 57 may be formed in the titanium nitride film 57. As a result, the heating unit 35 becomes bowing, and a cavity 57 may be formed therein.

By providing the cavity 57 in the heating unit 35, the thickness thereof can be reduced. As a result, the electrical resistivity of the heating unit 35 can be increased, and thus, the heating efficiency can be improved.

Continuing as illustrated in FIG. 9A, a not-illustrated carbon film is formed on the entire surface by using CVD; and the multiple through-holes 21 extending in the stacking direction of the stacked body are made by using known lithography and reactive ion etching methods. The through-holes 21 are made to communicate with the linking hole 22. Subsequently, the silicon nitride film 51 that was filled into the linking hole 22 is selectively removed via the through-holes 21. The removal of the silicon nitride film 51 may be performed by using, for example, hot phosphoric acid and the like. Then, a U-shaped through-hole that is used as the mold of the memory cells 24 is made by removing the carbon film.

Then, as illustrated in FIG. 9B, the blocking layer 25, the charge storage layer 26, and the tunneling layer 27 are formed in order from the inner surface sides of the through-holes 21 and the linking hole 22. These films may be formed by using, for example, ALD (Atomic Layer Deposition) and LPCVD (low pressure chemical vapor deposition). Subsequently, the semiconductor pillars 31 and the connection member 32 are formed by filling amorphous silicon.

Subsequently, the source/drain region portion 34 is formed. First, the films that are formed in the upper end portion of the through-holes 21 are caused to recede by using reactive ion etching. Subsequently, polycrystalline silicon is filled into the receded portion. Continuing, the source/drain region portion 34 is formed by performing ion implantation of arsenic into the filled polycrystalline silicon by using known lithography and ion implantation methods.

Then, not-illustrated source lines, bit lines, vias, contacts, draw-out interconnects, upper layer interconnects, and the like are appropriately formed above the insulating film 19.

The draw-out portions 103a and 103b of the interconnects of the heating unit 35, etc., described above may be formed.

Thus, the semiconductor memory device 1 can be manufactured.

In the method for manufacturing the semiconductor memory device 1a, it is sufficient for the heating unit 35a to be formed in the interior of the insulating film 10a that is provided on the substrate 11. Because the heating unit 35a can be formed using known film formation, lithography, and reactive ion etching methods and the like, a detailed description relating to the method for manufacturing the semiconductor memory device 1a is omitted.

According to the embodiments illustrated above, a semiconductor memory device and a method for manufacturing the semiconductor memory device can be realized to recover the reliability of data retention characteristics.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
a stacked body including a plurality of first insulating films stacked alternately with a plurality of electrode films;
a semiconductor pillar piercing the stacked body;
a charge storage layer provided between the electrode films and the semiconductor pillar;
a tunneling layer provided between the charge storage layer and the semiconductor pillar;
a dividing trench provided between the semiconductor pillars in one direction orthogonal to a stacking direction of the stacked body to divide the electrode films; and
a first heating unit provided in an interior of the dividing trench.

2. The device according to claim 1, wherein the first heating unit is capable of de-trapping trapped electrons by heating the tunneling layer.

3. The device according to claim 1, wherein the first heating unit is configured to generate Joule heat.

4. The device according to claim 1, wherein the first heating unit is formed using a conductor.

5. The device according to claim 1, wherein the first heating unit includes at least one selected from titanium nitride (TiN) and a metal.

6. The device according to claim 1, wherein the first heating unit has a plate configuration, and a periphery of the first heating unit is covered with an insulator.

7. The device according to claim 1, further comprising:
an exothermic unit configured to generate Joule heat; and
a heat conduction unit configured to conduct the generated heat to the first heating unit.

8. The device according to claim 1, further comprising a plurality of blocks, each block including a plurality of memory strings formed along the stacking direction of the semiconductor pillar,
the first heating unit being configured to perform heating by region, each of the regions including at least one memory string.

9. The device according to claim 8, wherein a layer is provided between the plurality of blocks, the layer being configured to suppress conduction of heat.

10. The device according to claim 8, comprising a contact provided between the plurality of blocks to connect the first heating unit to an interconnect provided outside the plurality of blocks.

11. The device according to claim 10, wherein the contact is provided commonly for adjacent blocks.

12. The device according to claim 10, wherein:
the plurality of blocks is provided in a matrix configuration; and
the contact is provided in a position to reduce the difference between a temperature inside the blocks and a temperature outside the blocks.

13. The device according to claim 8, wherein:
the plurality of blocks is provided in a matrix configuration; and
the device further comprises a second heating unit provided in a periphery of the plurality of blocks.

14. The device according to claim 1, further comprising a control unit configured to execute a method for de-trapping electrons,
the control unit being configured to execute the method for de-trapping electrons in the case where a programming operation and an erasing operation of data are performed a prescribed number of times.

15. The device according to claim 14, wherein:
the control unit transfers the programmed data of a region to undergo the de-trapping of electrons to a region other than the region to undergo the de-trapping; and
the first heating unit is caused to execute the heating after the transferring of the data.

16. The device according to claim 15, wherein the control unit returns the transferred data to the original region after the first heating unit executes the heating.

17. The device according to claim 14, wherein:
the control unit transfers the programmed data of a region to undergo the de-trapping of electrons to a memory device provided externally; and
the first heating unit is caused to execute the heating after the transferring of the data.

18. The device according to claim 17, wherein the control unit returns the transferred data to the original region after the first heating unit executes the heating.

* * * * *